US007366578B2

(12) United States Patent
Yamamoto et al.

(10) Patent No.: US 7,366,578 B2
(45) Date of Patent: Apr. 29, 2008

(54) METHOD, PROGRAM AND SYSTEM FOR DESIGNING SHAPE OF PRODUCT, SUCH AS A TIRE

(75) Inventors: Takuya Yamamoto, Kobe (JP); Masatoshi Tanaka, Kobe (JP); Kazuyuki Kohara, Kobe (JP)

(73) Assignee: Sumitomo Rubber Industries, Ltd., Kobe-shi, Hyogo (JP)

( * ) Notice: Subject to any disclaimer, the term of this patent is extended or adjusted under 35 U.S.C. 154(b) by 64 days.

(21) Appl. No.: 11/274,295

(22) Filed: Nov. 16, 2005

(65) Prior Publication Data

US 2006/0136082 A1   Jun. 22, 2006

(30) Foreign Application Priority Data

Dec. 20, 2004   (JP) .............................. 2004-367103

(51) Int. Cl.
*G06F 19/00* (2006.01)
(52) U.S. Cl. ........................................ 700/98; 700/182
(58) Field of Classification Search ............ 700/96–98, 700/105, 182; 706/919–923; 715/964; 152/454, 152/209.1–209.28
See application file for complete search history.

(56) References Cited

U.S. PATENT DOCUMENTS 4,976,300 A * 12/1990 Takehara et al. ............ 152/454
5,570,292 A * 10/1996 Abraham et al. ............ 700/157
5,659,478 A *  8/1997 Pennisi et al. ................ 700/95
5,710,718 A *  1/1998 Kamegawa et al. ........... 703/1
5,731,982 A *  3/1998 Namba et al. .............. 700/182
5,803,999 A *  9/1998 Shibata .................. 152/209.14
6,073,668 A *  6/2000 Iwasaki et al. ......... 152/209.14

(Continued)

FOREIGN PATENT DOCUMENTS

EP          0 752 326 A      1/1997

(Continued)

OTHER PUBLICATIONS

Shah J.J. et al: "Feature Concepts", Parametric and Feature-Based CAD/CAM. Concepts, Techniques and Applications, Wiley, New York, NY, US, pp. 78-84, (1995). XP002396824.

(Continued)

*Primary Examiner*—M. N. Von Buhr
(74) *Attorney, Agent, or Firm*—Birch, Stewart, Kolasch & Birch, LLP

(57) ABSTRACT

Typical numeric data for specifying a shape of a first product having a typical size are stored in a storage portion. By an input portion (10), a size of a second product other than the typical size is input. A calculating portion (4) determines recommended numeric data for specifying a shape of the second product based on the size of the second product and the typical numeric data. By the input portion (10), furthermore, corrected numeric data for the recommended numeric data are input. The calculating portion (4) decides the validity of the corrected numeric data. In the case in which the corrected numeric data have the validity, the calculating portion (4) determines final numeric data for specifying the shape of the second product based on the recommended numeric data and the corrected numeric data. Based on the final numeric data, the shape of the second product is drawn by CAD software.

6 Claims, 9 Drawing Sheets

U.S. PATENT DOCUMENTS

| | | | |
|---|---|---|---|
| 6,430,993 B1 * | 8/2002 | Seta | 73/146 |
| 6,775,585 B2 * | 8/2004 | Bedont et al. | 700/182 |
| 6,868,716 B2 * | 3/2005 | Okano et al. | 73/146 |
| 6,871,109 B2 * | 3/2005 | Yamada et al. | 700/98 |
| 7,003,359 B2 * | 2/2006 | Phelps et al. | 700/97 |
| 7,050,925 B2 * | 5/2006 | Simakov et al. | 702/127 |
| 7,133,736 B2 * | 11/2006 | Caretta et al. | 700/117 |
| 7,187,992 B2 * | 3/2007 | Tuszynski | 700/97 |
| 2004/0034445 A1 * | 2/2004 | Liu | 700/197 |
| 2004/0093106 A1 | 5/2004 | Stuckey | |

FOREIGN PATENT DOCUMENTS

| | | |
|---|---|---|
| JP | 05012385 A * | 1/1993 |
| JP | 2000-296706 A | 10/2000 |
| JP | 2002-301916 A | 10/2002 |

OTHER PUBLICATIONS

Shah J.J. et al; "Feature Concepts", Parametric and Feature-Based CAD/CAM Concepts, Techniques and Applications, Wiley, New York, NY, US, pp. 91-121, (1995). XP002389678.

Crose et al., Parametric Design/Analysis with MSC/PATRAN—A New Capability pp. 1-17, (1999). XP002394087.

"MSC Aerospace Users' Conference Proceedings", pp. 1-16, (1999). XP002394088.

Heinritz et al., SAE Transactions, Society of Automotive Engineers, Inc.,, vol. 112, No. 6, pp. 93-100, (2003). XP009070375.

Blundell, Proceeding of the Institution of Mechanical Engineerds, XX, XX, vol. 214, No. 1, Part K, pp. 1-32, (2000). XP009059731.

Chu et al., Computers in Industry, Elsevier Science Publishers, vol. 57, No. 1, pp. 11-25, (Jan. 2006). XP005179622.

* cited by examiner

Profile Design Tool

Create new profile

Tyre size

| mm | % | inch |
|---|---|---|
| 205 | 65 | 15 |

Extrapolate new size

Tyre size

| | mm | % | inch |
|---|---|---|---|
| Base | 205 | 65 | 15 |
| New | 245 | 40 | 18 |

Fig. 4

Create new profile

| Tyre size | | | Rim width | | | | Standard information | | | | | |
|---|---|---|---|---|---|---|---|---|---|---|---|---|
| | | | | | | | Overall diameter | | | Section width | | |
| | | | Rth | Rm | Rmin | Rmax | Do | Dmax | Dmin | S | Smax | Smin |
| mm | % | inch | mm | inch | inch | inch | mm | mm | mm | mm | mm | mm |
| 205 | 65 | 15 | 143.5 | 6 | 5.5 | 7.5 | 647 | 655 | 639 | 209 | 217 | 201 |

Basic mold dimensions

| D1 | W1 | W2 | D2 | BH |
|---|---|---|---|---|
| mm | mm | mm | mm | mm |
| 645 | 178 | 217.8 | 378.9 | 67.8 |
| 645 | 178 | 217.8 | 378.9 | 67.8 |

Tread dimensions

| W3 | Param1 | Param2 |
|---|---|---|
| mm | mm | |
| 170 | 7.97 | 1.78 |
| 170 | 7.97 | 1.78 |

Sidewall dimensions

| R1 | θ | L1 | R2 | R2/W2 | R3 | Dent | R4 | R5 | R6 | Bulge |
|---|---|---|---|---|---|---|---|---|---|---|
| mm | deg | mm | mm | % | mm | mm | mm | mm | mm | mm |
| 35.4 | 33 | | 69.13 | 31.7 | | | 81.945 | 81.945 | 81.945 | |
| 35.4 | 33 | | 39.13 | 31.7 | | 0 | 81.945 | 81.945 | 81.945 | 0 |

Create profile

Buttress option

Clinch option

Contact shape viewer

Back

Fig. 5

Buttress option

| D2 | D1 | W2 | H1 | W3 | Param1 | R1 | R1/W3 | θ | L1 | R2 | R3 | Dent |
|---|---|---|---|---|---|---|---|---|---|---|---|---|
| mm | mm | mm | mm | mm | mm | mm | % | deg | mm | mm | mm | mm |
| 378.9 | 645 | 214.6 | 67.8 | 167 | 7.83 | 34.7 | 20.78 | 33 | 8.1864 | 70.122 | | |

Option 1-1 : input R1 & θ → output L1 & R2

| D2 | D1 | W2 | H1 | W3 | Param1 | R1 | R1/W3 | θ | L1 | R2 | R3 | Dent |
|---|---|---|---|---|---|---|---|---|---|---|---|---|
| mm | mm | mm | mm | mm | mm | mm | % | deg | mm | mm | mm | mm |
| 378.9 | 645 | 214.6 | 67.8 | 167 | 7.83 | | 0 | | | | | |

Option 1-2 : input R2 & R1 → output θ & L1

| D2 | D1 | W2 | H1 | W3 | Param1 | R1 | R1/W3 | θ | L1 | R2 | R3 | Dent |
|---|---|---|---|---|---|---|---|---|---|---|---|---|
| mm | mm | mm | mm | mm | mm | mm | % | deg | mm | mm | mm | mm |
| 378.9 | 645 | 214.6 | 67.8 | 167 | 7.83 | | 0 | | | | | |

Option 1-3 : input R1 & L1 → output θ & R2

| D2 | D1 | W2 | H1 | W3 | Param1 | R1 | R1/W3 | θ | L1 | R2 | R3 | Dent |
|---|---|---|---|---|---|---|---|---|---|---|---|---|
| mm | mm | mm | mm | mm | mm | mm | % | deg | mm | mm | mm | mm |
| 378.9 | 645 | 214.6 | 67.8 | 167 | 7.83 | 30 | 17.96 | 31.033 | 15 | 64.336 | | |

Option 1-4 : input L1 & R2 → output R1 & θ

| D2 | D1 | W2 | H1 | W3 | Param1 | R1 | R1/W3 | θ | L1 | R2 | R3 | Dent |
|---|---|---|---|---|---|---|---|---|---|---|---|---|
| mm | mm | mm | mm | mm | mm | mm | % | deg | mm | mm | mm | mm |
| 378.9 | 645 | 214.6 | 67.8 | 167 | 7.83 | | 0 | | | | | |

Option 2 : input R3 → output Dent

| D2 | D1 | W2 | H1 | W3 | Param1 | R1 | R1/W3 | θ | L1 | R2 | R3 | Dent |
|---|---|---|---|---|---|---|---|---|---|---|---|---|
| mm | mm | mm | mm | mm | mm | mm | % | deg | mm | mm | mm | mm |
| 378.9 | 645 | 214.6 | 67.8 | 167 | 7.83 | 34.7 | 17.96 | 31.033 | 15 | 64.336 | 5 | 0.5577 |

Save option

Fig. 6

Clinch Option

| D2 | W1 | W2 | H1 | R4 | R5 | R6 | Bulge |
|---|---|---|---|---|---|---|---|
| mm | mm | mm | mm | mm | mm | mm | mm |
| 378.9 | 170 | 214.6 | 67.8 |  | 74.266 | 74.266 |  |
| 378.9 | 170 | 214.6 | 67.8 | 74.266 | 74.266 | 74.266 | 0 |

Option : input R5 & R6 → output Bulge

| D2 | W1 | W2 | H1 | R4 | R5 | R6 | Bulge |
|---|---|---|---|---|---|---|---|
| mm | mm | mm | mm | mm | mm | mm | mm |
| 378.9 | 170 | 214.6 | 67.8 | 74.266 | 90 | 30 | 1.3945 |

Save option

Fig. 7

Extrapolate new size

| | Tyre size | | | | Rim width | | | | Standard information | | | | | | |
|---|---|---|---|---|---|---|---|---|---|---|---|---|---|---|---|
| | | | | Rth | Rm | Rmin | Rmax | | Overall diameter | | | Section width | | |
| | | | | | | | | | Do | Dmax | Dmin | S | Smax | Smin |
| | mm | % | inch | mm | inch | inch | inch | | mm | mm | mm | mm | mm | mm |
| Base | 205 | 65 | 15 | 143.5 | 6 | 5.5 | 7.5 | | 647 | 655 | 639 | 209 | 217 | 201 |
| New | 245 | 40 | 18 | 208.25 | 8.5 | 8 | 9.5 | | 653 | 659 | 647 | 248 | 258 | 238 |

Basic mold dimensions

| | D1 | W1 | W2 | D2 | H1 |
|---|---|---|---|---|---|
| | mm | mm | mm | mm | mm |
| Base | 645 | 178 | 217.8 | 378.9 | 67.8 |
| Base | 645 | 178 | 217.8 | 378.9 | 67.8 |
| New | 650 | 250 | 263.5 | 460.7 | 47 |
| New | 650 | 250 | 263.5 | 460.7 | 47 |

Tread dimensions

| | W3 | Param1 | Param2 |
|---|---|---|---|
| | mm | mm | mm |
| | 170 | 7.97 | 1.78 |
| | 170 | 7.97 | 1.78 |
| | 228 | 11.49 | 1.04 |
| | 228 | 11.49 | 1.04 |

Sidewall dimensions

| | R1 | θ | L1 | R2 | R3 | Dent | R4 | R5 | R6 | Bulge |
|---|---|---|---|---|---|---|---|---|---|---|
| | mm | deg | mm | mm | mm | mm | mm | mm | mm | mm |
| Base | 35.4 | 33 | | 69.13 | 0 | | 81.945 | 81.945 | 81.945 | 0 |
| Base | 35.4 | 33 | | 39.13 | 0 | 0 | 81.945 | 81.945 | 81.945 | 0 |
| New | 29.2 | 36 | | 36.099 | | | | 91.56 | 91.56 | 0 |
| New | 29.2 | 36 | | 36.099 | 0 | | 91.56 | 91.56 | 91.56 | |

[Create profile]  [Buttress option]

[Clinch option]  [Contact shape viewer]

Fig. 8

METHOD, PROGRAM AND SYSTEM FOR DESIGNING SHAPE OF PRODUCT, SUCH AS A TIRE

This application claims priority on Japanese Patent Application No. 2004-367103 filed on Dec. 20, 2004, the entire contents of which are hereby incorporated by reference.

BACKGROUND OF THE INVENTION

1. Field of the Invention

The present invention relates to a computer system which is useful for designing the shapes of a plurality of products having different sizes.

2. Description of the Related Art

The profile of a tire influences the basic performance of the tire, for example, a handling stability or a ride comfort. It is necessary to determine a proper profile corresponding to the concept of the tire. Japanese Laid-Open Patent Publication No. 2002-301916 has disclosed a method of determining a tread profile using an involute function. For the determination of the profile, CAD software is used.

In order to write the size of a tire, generally, a nominal width, a nominal aspect ratio and a nominal rim diameter are used. For example, the size of a radial tire having a nominal width of 205 mm, a nominal aspect ratio of 65% and a nominal rim diameter of 15 inches is written in "205/65R15".

There are tires designed based on the same concept and having the same brand and different sizes from each other. There are brands having several ten sizes. In many cases, the profiles of the tires having the different sizes are not analogous to each other. In the case in which the profile of a tire having a typical size is designed, a profile having another size cannot be obtained even if each dimension of the profile is simply proportional-fold. In the design of the profile, trial and error for each size are repeated. This work requires a great deal of labor.

In products other than the tire, there is a problem in that a size cannot be developed in the simple proportional times of each dimension. For example, a great deal of labor is also required for the development of a size in a golf club, golf gloves, shoes, a wear, a cap and the like.

It is an object of the present invention to provide a system capable of easily developing a size.

SUMMARY OF THE INVENTION

A method of designing a shape of a product according to the present invention comprises the steps of:

inputting a size of a second product other than a typical size to a computer storing typical numeric data for specifying a shape of a first product having the typical size; and determining recommended numeric data for specifying a shape of the second product based on the size of the second product and the typical numeric data.

It is preferable that the designing method should further comprise the step of correcting the recommended numeric data, thereby determining final numeric data for specifying the shape of the second product.

The designing method may further comprise the steps of:

inputting corrected numeric data for the recommended numeric data;

deciding a validity of the corrected numeric data; and determining final numeric data for specifying the shape of the second product based on the typical numeric data or the recommended numeric data and the corrected numeric data when the corrected numeric data have the validity.

It is preferable that the designing method should further comprise the step of drawing a shape of a product by CAD software or FEM software based on the final numeric data.

A computer program according to the present invention is constituted to cause a computer to execute the steps of:

inputting a size of a second product other than a typical size to a computer storing typical numeric data for specifying a shape of a first product having the typical size; and determining recommended numeric data for specifying a shape of the second product based on the size of the second product and the typical numeric data.

A designing system according to the present invention comprises a storage portion for storing typical numeric data to specify a shape of a first product having a typical size;

an input portion for inputting a size of a second product other than the typical size; and a calculating portion for determining recommended numeric data to specify a shape of the second product based on the size of the second product and the typical numeric data.

BRIEF DESCRIPTION OF THE DRAWINGS

FIG. 4 is a front view showing a screen displayed on the system in FIG. 1, FIG. 5 is a front view showing a screen displayed on the system in FIG. 1, FIG. 6 is a front view showing a screen displayed on the system in FIG. 1, FIG. 7 is a front view showing a screen displayed on the system in FIG. 1, FIG. 8 is a front view showing a screen displayed on the system in FIG. 1.

DESCRIPTION OF THE PREFERRED EMBODIMENTS

The present invention will be described below in detail based on preferred embodiments with reference to the drawings.

Figure 1:
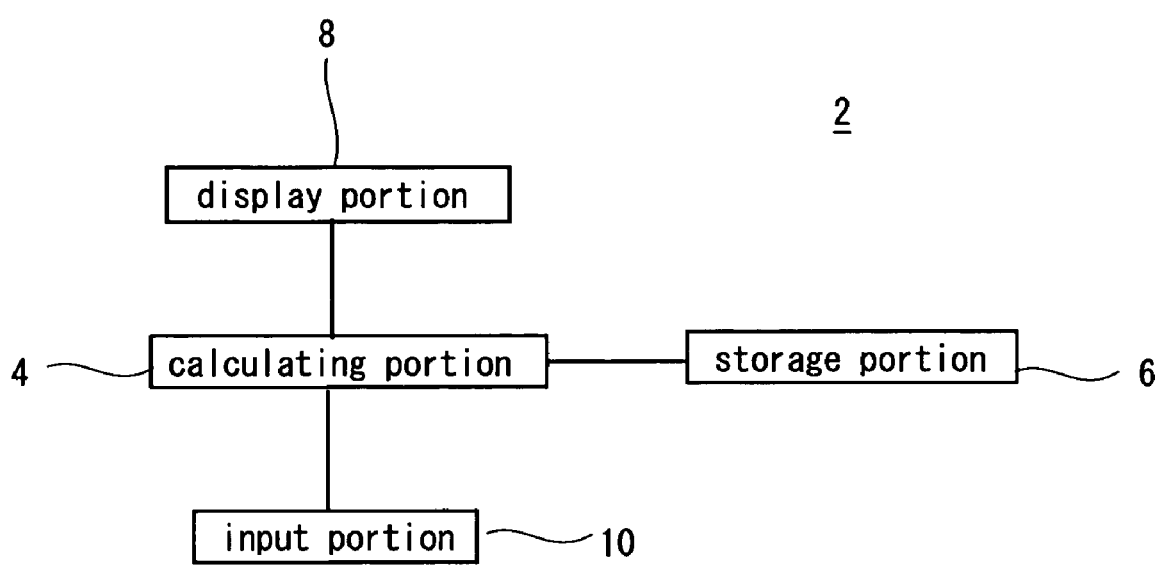
FIG. 1 is a conceptual diagram showing a system according to an embodiment of the present invention.

As a system 2 shown in FIG. 1, typically, a personal computer is used. The system 2 is used for designing the profile of a tire. The system 2 comprises a calculating portion 4, a storage portion 6, a display portion 8 and an input portion 10. The calculating portion 4 includes a CPU. The typical storage portion 6 is a hard disk. The typical display portion 8 is a monitor. The typical input portion 10 is a keyboard and a mouse. In the system 2, each step is executed by a computer program stored in the storage portion 6.

Figure 2:
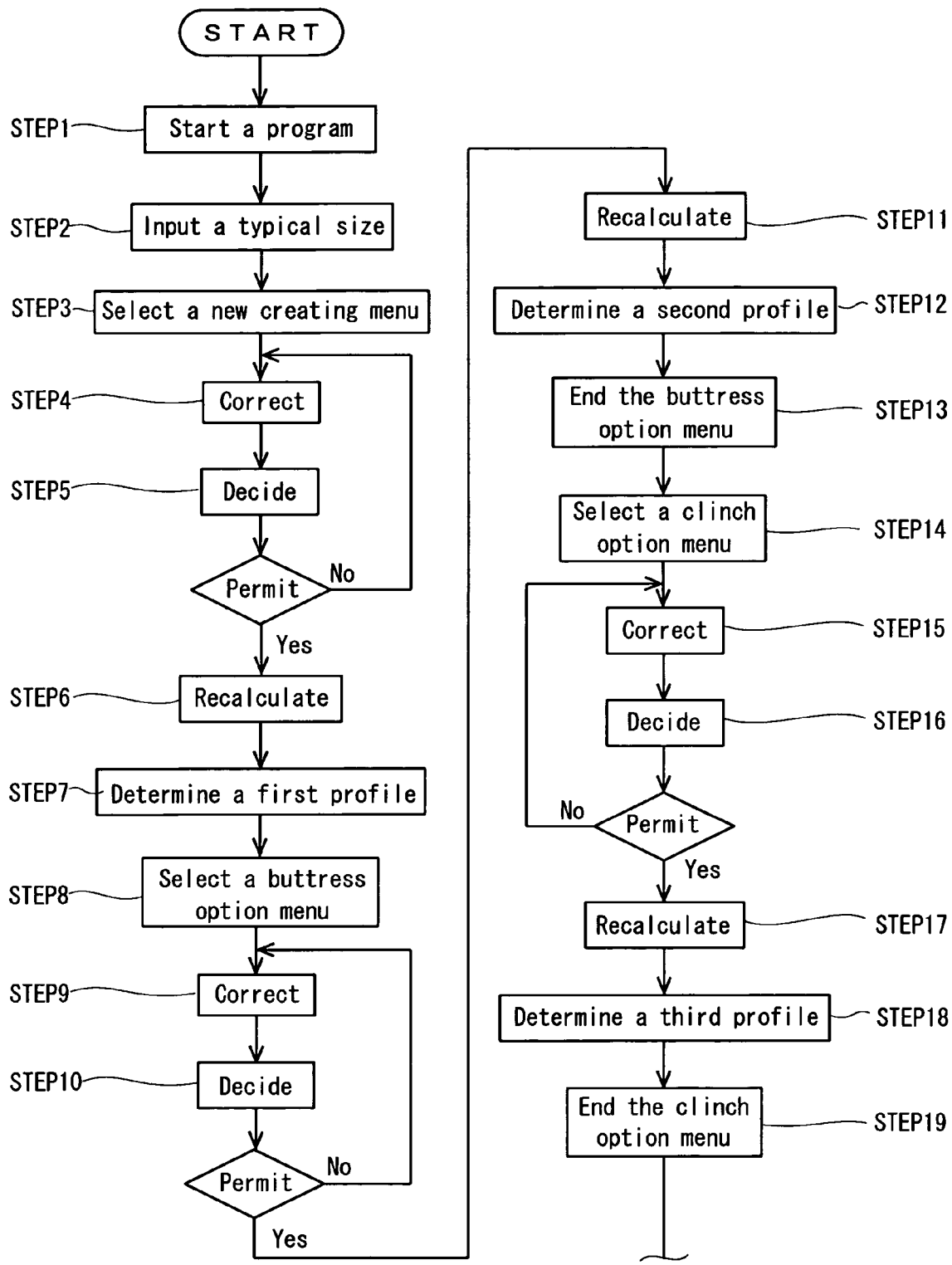
FIG. 2 is a flowchart showing an example of a designing method using the system in FIG. 1.
Figure 3:
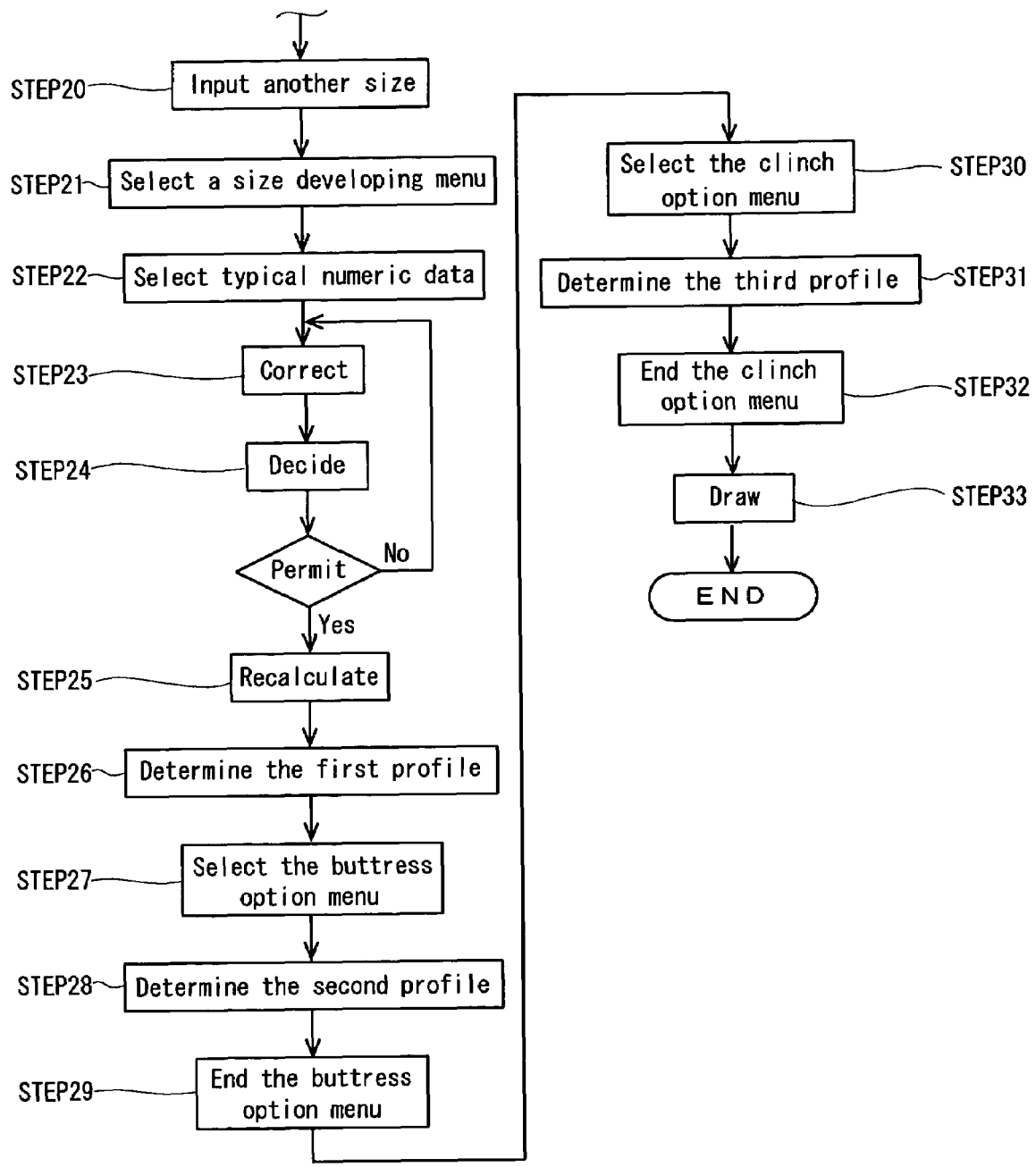
FIG. 3 is a flowchart showing an example of the designing method using the system in FIG. 1.

FIGS. 2 and 3 are flowcharts showing an example of a designing method using the system 2 in FIG. 1. In the designing method, first of all, a computer program is started (STEP 1). By the starting operation, an initial screen shown in FIG. 4 is displayed on the display portion 8. For the initial screen, a button of "Create new profile" and a button of "Extrapolate new size" are prepared. When the button of "Create new profile" is clicked, a new creating menu is selected. When the button of "Extrapolate new size" is selected, a size developing menu is selected. In a table shown in FIG. 4, a cell surrounded by a heavy line is an input enable cell. An operator inputs a typical size of the tire to the table of the new creating menu (STEP 2). The input portion 10 is used for the input. In an example of FIG. 4, 205 mm is input as a nominal width (mm), 65% is input as a nominal aspect ratio (%), and 15 is input as a nominal rim diameter (inch). In the designing method, "205/65R15" is a typical size. A tire having the typical size is a first product. After the input, the operator clicks the button of "Create new profile". By the click, the new creating menu is selected (STEP 3).

By the selection of the new creating menu, a screen shown in FIG. 5 is displayed on the display portion 8. The screen includes a table for Standard information. The screen also includes tables for Basic mold dimensions, Tread dimensions and Sidewall dimensions. The Standard information, the Basic mold dimensions, the Tread dimensions and the Sidewall dimensions are calculated based on the typical size. The calculation is carried out by the calculating portion 4. In order to take standards and technical know-how into consideration in the calculation, a program is created.

In the screen shown in FIG. 5, each of the tables for the Basic mold dimensions, the Tread dimensions and the Sidewall dimensions includes two upper and lower rows for numeric data. In FIG. 5, the same numeric data are displayed on the upper and lower rows. The lower row includes a cell surrounded by a heavy line. The cell is an input enable cell. An operator inputs different numeric values from numeric values which have already been displayed to any of the input enable cells if necessary. In other words, the operator corrects the numeric data (STEP 4). The calculating portion 4 decides whether the correction is permitted or not (STEP5). If the correction is not permitted, a recorrection is promoted. If the correction is permitted, the calculating portion 4 recalculates the Basic mold dimensions, the Tread dimensions and the Sidewall dimensions based on the numeric data thus corrected (STEP 6). The result of the recalculation is displayed on the lowermost row of each table. The operator also carries out the correction for other cells if necessary (STEP 4). In a stage in which the correction is completed, the operator clicks a button of "Create profile". By the click, a first profile is determined (STEP 7).

Next, the operator clicks a button of "Buttress option" on the screen shown in FIG. 5 if necessary. By the click, a buttress option menu is selected (STEP 8). By the selection, a screen shown in FIG. 6 is displayed on the display portion 8.

A buttress is positioned between a tread and a sidewall in a tire. The buttress includes an arcuate shoulder linked to the tread and a regulating portion provided in contact with the shoulder and the sidewall. In this example, the regulating portion is flat. The regulating portion may include a dent. In the buttress option menu, the detailed shape of the buttress can be designed.

In a table shown in FIG. 6, "R1" represents a radius of curvature of the shoulder, "θ" represents an angle of the regulating portion in a predetermined direction (for example, a vertical direction), "L1" represents a distance of the regulating portion, "R2" represents a radius of curvature of the upper part of the sidewall, "R3" represents a radius of curvature of the dent, and "Dent" represents a depth of the dent. In the screen of FIG. 6, five options are prepared. In "Option 1-1", "R1" and "θ" are input and "L1" and "R2" are output. In "Option 1-2", "R2" and "R1" are input and "θ" and "L1" are output. In "Option 1-3", "R1" and "L1" are input and "θ" and "R2" are output. In "Option 1-4", "L1" and "R2" are input and "R1" and "θ" are output. In "Option 2", "R3" is input and "Dent" is output.

In the screen of FIG. 6, the operator inputs a numeric value to a cell surrounded by a heavy line, thereby correcting numeric data (STEP 9). The calculating portion 4 decides whether the correction is permitted or not (STEP 10). If the correction is not permitted, a recorrection is promoted. If the correction is permitted, the calculating portion 4 recalculates each of the dimensions based on the corrected numeric data (STEP 11). If the recalculated dimension is satisfied, the operator clicks a button of "Save option". By the click, a second profile is determined (STEP 12) and the buttress option menu is ended (STEP 13). By the end, the screen shown in FIG. 5 is displayed again.

In the screen of FIG. 5, next, the operator clicks a button of "Clinch option" if necessary. By the click, a clinch option menu is selected (STEP 14). By the selection, a screen shown in FIG. 7 is displayed on the display portion 8.

A clinch corresponds to the lower part of the sidewall of the tire. Although an ordinary clinch has a single radius, it is set to have a double radius so that a bulge is formed in some cases. In the clinch option menu, the detailed shape of the clinch having the bulge formed thereon can be designed.

In a table shown in FIG. 7, "R4" represents a radius of curvature of the lower part of the sidewall in a state in which the bulge is not formed, "R5" represents a first radius of curvature of the bulge, "R6" represents a second radius of curvature of the bulge, and "Bulge" represents a height of the bulge. The operator inputs numeric values to the cells of "R5" and "R6", thereby correcting numeric data (STEP 15). The calculating portion 4 decides whether the correction is permitted or not (STEP 16). If the correction is not permitted, a recorrection is promoted. If the correction is permitted, the calculating portion 4 recalculates "Bulge" based on the corrected numeric data (STEP 17). If the result of the recalculation is satisfied, the operator clicks the button of "Save option". By the click, a third profile is determined (STEP 18) and the clinch option menu is ended (STEP 19). By the end, the screen shown in FIG. 5 is displayed again.

By the operation described above, the first profile, the second profile and the third profile of the tire to be the first product having a typical size of "205/65R15" are determined. Data specifying the shape of each of the profiles are stored in the storage portion 6. A further correction may be carried out to determine four profiles or more. When the operator clicks a button of "back", the initial screen shown in FIG. 4 is displayed on the display portion 8.

Next, the operator inputs a different size from the typical size to the table for the size developing menu in the initial screen shown in FIG. 4 (STEP 20). In the example of FIG. 4, 245 mm is input as a nominal width (mm), 40% is input as a nominal aspect ratio (%), and 18 is input as a nominal rim diameter (inch). In this example, a tire having a size of "245/40R18" is a second product. After inputting the size, the operator clicks the button of "Extrapolate new size". By the click, the size developing menu is selected (STEP 21).

By the selection of the size developing menu, a history table (not shown) is displayed on the display portion 8. By the operations from the STEP 2 to the STEP 19, the first profile, the second profile and the third profile are designed as the profiles of the first product. These three profiles are displayed on the history table. The operator clicks any of the profiles to select the profile to be used for a size development. In other words, typical numeric data are determined (STEP 22).

By the determination of the typical numeric data, a screen shown in FIG. 8 is displayed on the display portion 8. The screen includes the table for Standard information. The screen also includes the tables for Basic mold dimensions, Tread dimensions and Sidewall dimensions.

As shown in FIG. 8, the table for Standard information includes a row of "Base" and a row of "New". The typical numeric data stored in the storage portion 6 are described in the row of "Base". Numeric data calculated based on "245/40R18" to be the size of the second product and the typical numeric data are described in the row of "New". The calculation is carried out by the calculating portion 4. In order to take standards and technical know-how into consideration in the calculation, a program is created. The numeric data in the row of "New" are recommended numeric data.

In the screen shown in FIG. 8, each of the tables for the Basic mold dimensions, the Tread dimensions and the Sidewall dimensions includes two rows of "Base" and two rows of "New". The typical numeric data stored in the storage portion 6 are described in the row of "Base". Numeric data calculated based on "245/40R18" to be the size of the second product and the typical numeric data are described in the row of "New". The calculation is carried out by the calculating portion 4. In order to take standards and technical know-how into consideration in the calculation, a program is created. The numeric data in the row of "New" are the recommended numeric data.

As described above, each of the tables for the Basic mold dimensions, the Tread dimensions and the Sidewall dimensions includes two rows of "Base". In FIG. 8, the same numeric data are displayed on the upper and lower rows. The lower row includes a cell surrounded by a heavy line. The cell is an input enable cell.

As described above, each of the tables for the Basic mold dimensions, the Tread dimensions and the Sidewall dimensions includes two rows of "New". In FIG. 8, the same numeric data are displayed on the upper and lower rows. The lower row includes a cell surrounded by a heavy line. The cell is an input enable cell.

An operator inputs different numeric values from numeric values which have already been displayed to any of the input enable cells if necessary. In other words, the operator corrects the numeric data (STEP 23). The correction may be carried out in the row of "Base" and the row of "New". The calculating portion 4 decides whether the correction is permitted or not (STEP 24). If the correction is not permitted, a recorrection is promoted. If the correction is permitted, the calculating portion 4 recalculates the Basic mold dimensions, the Tread dimensions and the Sidewall dimensions based on the numeric data thus corrected (STEP 25). The recalculation is carried out based on the typical numeric data or the recommended numeric data and the corrected numeric data. The result of the recalculation is displayed on each of the tables. If the correction is carried out in the row of "Base", a numeric value reflected by the correction is displayed in the row of "New". By the correction, numeric data reflected by a peculiar design thought to the size of "245/40R18" are obtained. The operator carries out the correction for other cells if necessary (STEP 23). In a stage in which the correction is completed, the operator clicks the button of "Create profile". By the click, the first profile of the second product is determined (STEP 26).

Next, the operator clicks the button of "Buttress option" in the screen shown in FIG. 8 if necessary. By the click, the buttress option menu is selected (STEP 27). By the selection, the screen of the buttress option (not shown) is displayed on the display portion 8. The screen is similar to the screen shown in FIG. 6. In the screen, the shape of the buttress is corrected in accordance with the operations from the STEP 8 to the STEP 12. By the correction, the second profile of the second product is determined (STEP 28). By the determination, the buttress option menu is ended (STEP 29). By the end, the screen shown in FIG. 8 is displayed on the display portion 8.

Then, the operator clicks the button of "Clinch option" in the screen shown in FIG. 8 if necessary. By the click, the clinch option menu is selected (STEP 30). By the selection, the screen of the clinch option (not shown) is displayed on the display portion 8. The screen is similar to the screen shown in FIG. 7. In the screen, the shape of the clinch is corrected in accordance with the operations from the STEP 14 to the STEP 18. By the correction, the third profile of the second product is determined (STEP 31). By the determination, the clinch option menu is ended (STEP 32). By the end, the screen shown in FIG. 8 is displayed on the display portion 8.

By the operation described above, the profile of the second product having the size of "245/40R18" is determined. Data specifying the shape of each profile are stored in the storage portion 6. The data are final numeric data. Based on the final numeric data, the profile of the second product is drawn by CAD software (STEP 33). FEM software may be used in place of the CAD software. By repeating the operations from the STEP 20 to the STEP 33, furthermore, it is also possible to obtain the profiles of tires having other sizes.

Figure 9:
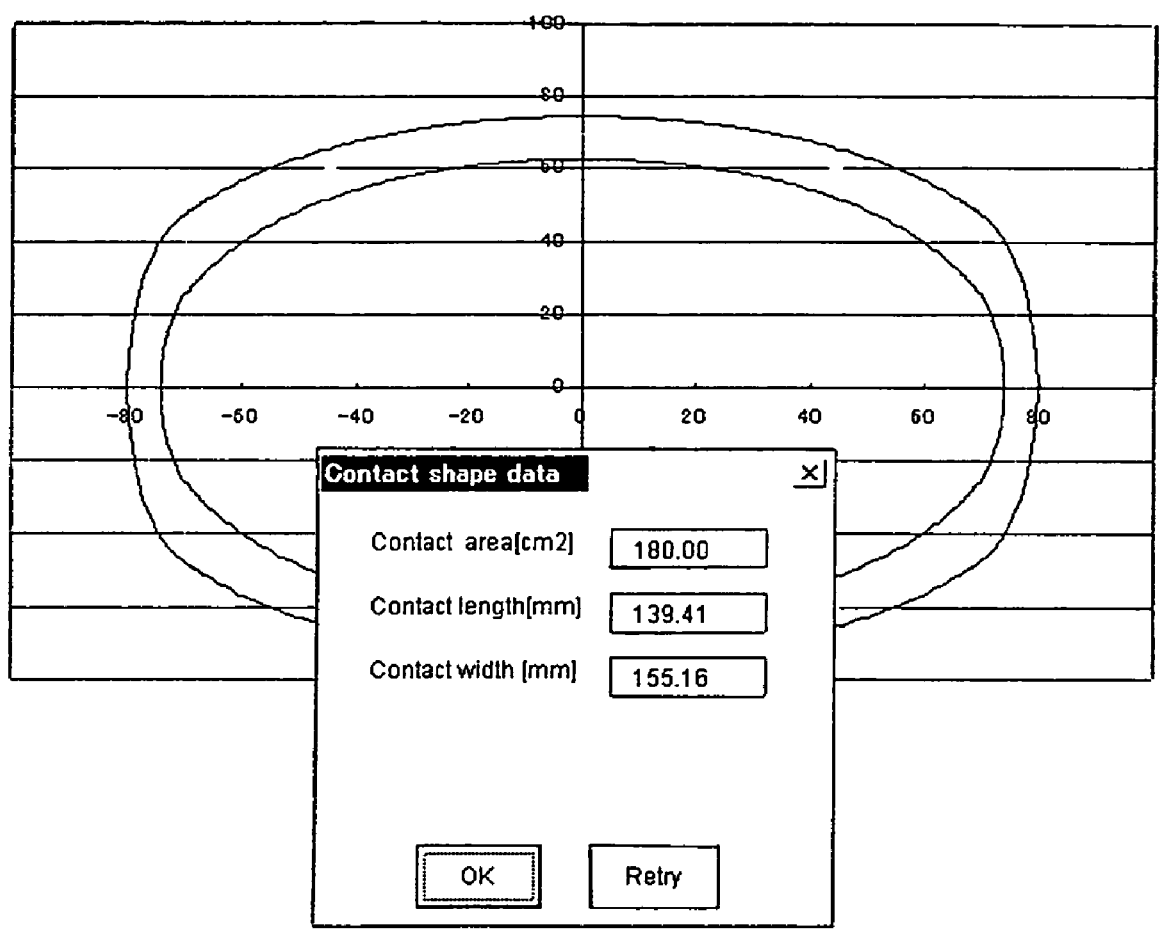
FIG. 9 is a front view showing a screen displayed on the system in FIG. 1.

In the screens shown in FIGS. 5 and 8, a button of "Contact shape viewer" is prepared. When this button is clicked, a screen shown in FIG. 9 is displayed. The contact shape of the tire is shown on the screen. By this menu, the operator can design a profile while referring to the contact shape at any time.

As described above, in the designing method according to the present invention, it is possible to easily design the shapes of a plurality of products having different sizes. The numeric data obtained by the designing method are general purpose data, for example, spreadsheet program data. The data can be utilized in various types of CAD software and FEM software.

The above description is only illustrative and various changes can be made without departing from the scope of the present invention.

What is claimed is:

1. A method of designing a shape of a product comprising the steps of:
   a) inputting a nominal width, a nominal aspect ratio and a nominal rim diameter of a second product other than a typical size to a computer storing typical numeric data, including a basic mold dimension, a tread dimension and a sidewall dimension, as well as data regarding a shape of a buttress and data regarding a shape of a clinch, for specifying a shape of a first product having the typical size;
   b) determining recommended numeric data, including a basic mold dimension, a tread dimension and a sidewall dimension, as well as data regarding a shape of a buttress and data regarding a shape of a clinch, for specifying a shape of the second product based on the size of the second product and the typical numeric data, and
   c) providing a display of the results of step b).

2. A computer program carried on computer-readable media for designing a shape of a product, the program, when executed, causing a computer to execute the steps of:

a) inputting a nominal width, a nominal aspect ratio and a nominal rim diameter of a second product other than a typical size to a computer storing typical numeric data, including a basic mold dimension, a tread dimension and a sidewall dimension, as well as data regarding a shape of a buttress and data regarding a shape of a clinch, for specifying a shape of a first product having the typical size;

b) determining recommended numeric data, including a basic mold dimension, a tread dimension and a sidewall dimension, as well as data regarding a shape of a buttress and data regarding a shape of a clinch, for specifying a shape of the second product based on the size of the second product and the typical numeric data; and c) providing a display of the results of step b).

3. A system for designing a shape of a product comprising:

a storage portion for storing typical numeric data, including a basic mold dimension, a tread dimension and a sidewall dimension, as well as data regarding a shape of a buttress and data regarding a shape of a clinch, to specify a shape of a first product having a typical size;

an input portion for inputting a nominal width, a nominal aspect ratio and a nominal rim diameter of a second product other than a typical size;

a calculating portion for determining recommended numeric data, including a basic mold dimension, a tread dimension and a sidewall dimension, as well as data regarding a shape of a buttress and data regarding a shape of a clinch, to specify a shape of the second product based on the size of the second product and the typical numeric data; and a display portion for display in the data determined by the calculating portion.

4. A method of designing a shape of a product comprising the steps of a) inputting a nominal width, a nominal aspect ratio and a nominal rim diameter of a second product other than a typical size to a computer storing typical numeric data, including a basic mold dimension, a tread dimension and a sidewall dimension, as well as data regarding a shape of a buttress and data regarding a shape of a clinch, for specifying a shape of a first product having the typical size;

b) determining recommended numeric data, including a basic mold dimension, a tread dimension and a sidewall dimension, as well as data regarding a shape of a buttress and data regarding a shape of a clinch, for specifying a shape of the second product based on the size of the second product and the typical numeric data;

c) correcting the recommended numeric data, thereby determining final numeric data for specifying the shape of the second product; and d) providing a display of the results of step c).

5. A method of designing a shape of a product comprising the steps of:

a) inputting a nominal width, a nominal aspect ratio and a nominal rim diameter of a second product other than a typical size to a computer storing typical numeric data, including a basic mold dimension, a tread dimension and a sidewall dimension, as well as data regarding a shape of a buttress and data regarding a shape of a clinch, for specifying a shape of a first product having the typical size;

b) determining recommended numeric data, including a basic mold dimension, a tread dimension and a sidewall dimension, as well as data regarding a shape of a buttress and data regarding a shape of a clinch, for specifying a shape of the second product based on the size of the second product and the typical numeric data;

c) inputting corrected numeric data for the recommended numeric data;

d) deciding a validity of the corrected numeric data;

e) determining final numeric data for specifying the shape of the second product based on the typical numeric data or the recommended numeric data and the corrected numeric data when the corrected numeric data have the validity; and f) providing a display of the results of step e).

6. The designing method according to claim 5, further comprising the step of drawing a shape of a product by CAD (computer-aided design) software or FEM (finite element model) software based on the final numeric data.

* * * * *